(12) United States Patent
Cha et al.

(10) Patent No.: US 9,325,358 B2
(45) Date of Patent: Apr. 26, 2016

(54) METHOD FOR REDUCING SECOND ORDER DISTORTION IN HARMONIC REJECTION MIXER

(71) Applicants: IMEC, Leuven (BE); Renesas Electronics Corporation, Kanagawa (JP)

(72) Inventors: Sungwoo Cha, Kanagawa (JP); Jonathan Borremans, Lier (BE)

(73) Assignees: IMEC, Leuven (BE); Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/300,574

(22) Filed: Jun. 10, 2014

(65) Prior Publication Data

US 2014/0364076 A1    Dec. 11, 2014

(30) Foreign Application Priority Data

Jun. 10, 2013    (EP) .................................... 13171264

(51) Int. Cl.
*H04B 1/00* (2006.01)
*H04B 1/10* (2006.01)
*H03D 7/14* (2006.01)
*H04B 1/30* (2006.01)

(52) U.S. Cl.
CPC .. *H04B 1/10* (2013.01); *H03D 7/14* (2013.01); *H04B 1/30* (2013.01)

(58) Field of Classification Search
CPC ............... H04B 1/10; H04B 1/30; H03D 7/14
USPC ........ 455/114.1, 130, 190.1, 207, 209, 236.1, 455/293, 315, 326, 295, 296
See application file for complete search history.

(56) References Cited

U.S. PATENT DOCUMENTS

| | | | | |
|---|---|---|---|---|
| 8,331,424 | B2 * | 12/2012 | Razzell | H04B 1/7176 375/219 |
| 2010/0093298 | A1 * | 4/2010 | Pratt | H04B 17/21 455/226.1 |
| 2012/0105128 | A1 | 5/2012 | Jeurissen et al. | |
| 2012/0322398 | A1 * | 12/2012 | Pullela | H03D 7/1466 455/302 |

OTHER PUBLICATIONS

Cha, Hyouk-Kyu et al., "A CMOS Wideband RF Front-End With Mismatch Calibrated Harmonic Rejection Mixer for Terrestrial Digital TV Tuner Applications", IEEE Transactions on Microwave Theory and Techniques, vol. 58, No. 8, Aug. 2010, pp. 2143-2151.
Cha, Hyouk-Kyu et al., "A CMOS Harmonic Rejection Mixer With Mismatch Calibration Circuitry for Digital TV Tuner Applications", IEEE Microwave and Wireless Components Letters, vol. 18, No. 9, Sep. 2008, pp. 617-619.

* cited by examiner

*Primary Examiner* — Tuan Pham
(74) *Attorney, Agent, or Firm* — McDonnell Boehnen Hulbert & Berghoff LLP

(57) ABSTRACT

The present disclosure relates to a method for reducing second order intermodulation distortion in a harmonic rejection mixer arranged for down-converting a radio frequency signal to an in-phase and a quadrature baseband signal. The method includes adjusting an output current of a first mixer, to reduce the second order intermodulation distortion in the quadrature baseband signal to a first value, and adjusting an output current of a second mixer, to reduce the second order intermodulation distortion in the in-phase baseband signal to a second value.

5 Claims, 5 Drawing Sheets

METHOD FOR REDUCING SECOND ORDER DISTORTION IN HARMONIC REJECTION MIXER

CROSS-REFERENCE TO RELATED APPLICATION

This application claims priority to European Patent Application No. 13171264.8 filed on Jun. 10, 2013, the contents of which are hereby incorporated by reference.

FIELD OF THE DISCLOSURE

The present disclosure relates generally to a harmonic rejection mixer, and more specifically, to a method for reducing second order intermodulation distortion in a harmonic rejection mixer.

BACKGROUND OF THE DISCLOSURE

A wideband Software-Defined Radio (SDR) receiver is a promising solution to satisfy the demand for the multi-standard and multi-band wireless system. Most SDR receivers use a direct conversion architecture to obtain high integration. Telecommunication standards such as GSM, WCDMA, LTE, WLAN, etc., define in their specifications strict requirements for suppression of undesired signals. To comply with the requirements a Surface Acoustic Wave (SAW) filter may be used for each supported standard. However, driven by the market requirements for smaller and power efficient devices to decrease the Bill-of-Material (BoM) of the wireless devices, the SAW filters may be removed. This can cause problems that detrimentally affect the receiver performance. A direct-conversion receiver lacking a SAW filter may require more stringent constraints on some of the non-idealities of its analog circuitry, affecting the overall receiver performance.

In a transceiver including a transmitter and a receiver, a signal transmitted by the transmitter leaking into the front-end path of the receiver can detrimentally affect its performance. For example, in a receiver with no SAW filter and only a duplexer isolating the receiver from the transmitter, non-linearity problems may arise due to the considerably reduced attenuation of the leaked transmitted frequency into the receiver path. As the unwanted signals—interferences or leaked transmitter signal—are not suppressed, the receiver sensitivity may be degraded by the second order intermodulation distortion (IMD2) caused by its non-linear elements. In fact, every signal, even the desired signal, entering a non-linear element gives rise to distortion products by generating a signal centred at zero frequency (DC frequency). A highly linear receiver is thus desired to help to prevent generating distortion products at baseband frequency.

The second order intercept point (IP2) is a measure of the second order non-linearity of the receiver and helps quantifying the input level at which the power of second order intermodulation distortion (IMD2) products at baseband frequency equals the power of the desired signal. The presence of second order intermodulation distortion (IMD2) products, generated when a non-linear receiver is exposed to a multi-tone continuous wave signal or to an amplitude modulated signal, can substantially reduce the receiver sensitivity. A major source of non-linearity affecting the IP2 performance of a receiver includes transistor mismatch and layout asymmetry in the mixer. Thus, without a high IP2 of the mixer, the receiver sensitivity is greatly reduced.

SUMMARY OF THE DISCLOSURE

The present disclosure discloses a method for reducing second order intermodulation distortion in a harmonic rejection mixer.

The above objective is accomplished by the solution according to the present disclosure.

In one aspect, the present disclosure relates to a method for reducing second order intermodulation distortion in a harmonic rejection mixer arranged for down-converting a radio frequency signal to an in-phase and a quadrature baseband signal. The harmonic rejection mixer includes a plurality of mixers arranged for multiplying the radio frequency signal with a plurality of local oscillator signals, each local oscillator signal having a different phase with respect to the other local oscillator signals, thereby obtaining a plurality of down-converted signals having different phases with respect to each other, a plurality of amplifiers arranged for amplifying each down-converted signal with a factor depending on its phase, and a plurality of summing means for summing the plurality of amplified down-converted signals to produce the in-phase and the quadrature baseband signals The method includes adjusting an output current of a first mixer, to reduce second order intermodulation distortion in the quadrature baseband signal to a first value, and adjusting an output current of a second mixer, to reduce second order intermodulation distortion in the in-phase baseband signal to a second value.

In a harmonic rejection mixer (e.g., a harmonic rejection mixer employing 8-phase passive mixers) the I- and Q-baseband signals are reconstructed by recombining three mixer outputs. The proposed method allows reducing IMD2 in the reconstructed I- and Q-baseband signals at the harmonic rejection mixer output by calibrating only one mixer in each I- and Q-channel. This allows only one calibration circuitry to be used for calibrating a harmonic rejection mixer. The calibration method can as well be applied to a conventional four-phase mixer and thus reuse the same calibration circuitry.

In one embodiment, the first value is a minimum of the second order intermodulation distortion in the quadrature baseband signal.

In another embodiment, the second value is a minimum of the second order intermodulation distortion in the in-phase baseband signal.

In yet another embodiment, the first mixer is not contributing to the reconstruction of the in-phase baseband signal and the second mixer is not contributing to the reconstruction of the quadrature baseband signal. By calibrating the mixer which down-converted component does not affect the reconstruction of the two baseband signal components, the reduction of the second order intermodulation distortion in each of the I- and Q-baseband signal can be done separately. First, IP2 calibration of the I-baseband signal can be performed, followed by IP2 calibration of the Q-baseband signal, or vice versa.

In a further embodiment, each mixer may be a differential mixer. When calibrating a harmonic rejection mixer according to the present disclosure, using differential mixers, a goal of the method is to equalize the IMD2 product in the positive and negative components of each respective differential I- and Q-baseband signals. This allows the method to achieve a cost efficient and time saving IMD2 reduction.

Another aspect of the present disclosure relates to a method for reducing second order intermodulation distortion in a wireless device. The method allows further improvement of the linearity of a wireless device and can help to minimize its second order intermodulation distortion. This method allows the removal of the area expensive SAW filter used for suppressing a large amplitude modulated blocker signal close to the desired signal to achieve sufficient output SNR without IP2 calibration in the wireless device. Removing the SAW filter also allows a wider operating bandwidth of the receiver. Moreover, this method allows using a conventional IP calibration circuitry in a wireless device with a harmonic rejection mixer.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

BRIEF DESCRIPTION OF THE DRAWINGS

The disclosure will now be described further, by way of example, with reference to the accompanying drawings, wherein like reference numerals refer to like elements in the various figures.

DETAILED DESCRIPTION

Figure 1:
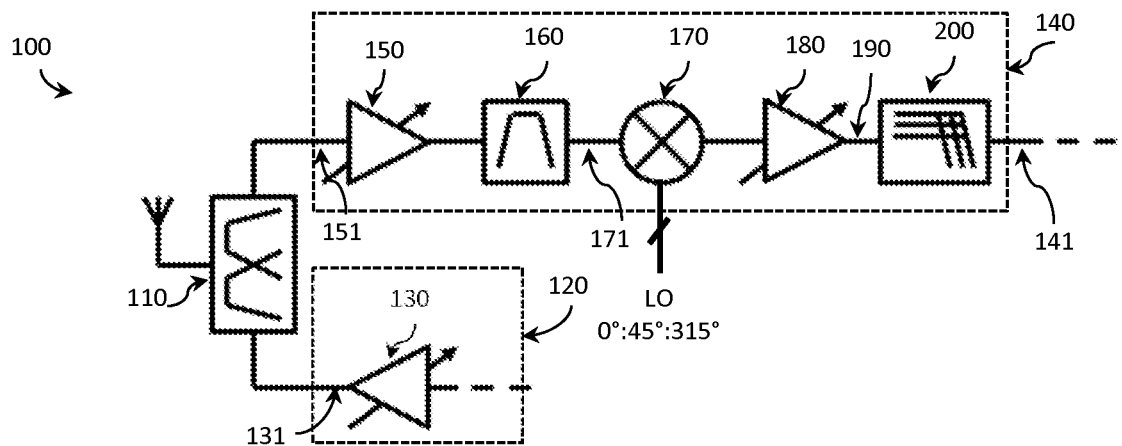
FIG. 1 illustrates a conventional FDD radio system employing a band-pass filter and a harmonic rejection mixer.

The present disclosure will be described with respect to particular embodiments and with reference to certain drawings but the disclosure is not limited thereto but only by the claims.

Furthermore, the terms first, second, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps, or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects may lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The problem of second order non-linearity will be explained in detail with reference to FIG. 1, which illustrates a front-end chain of an example FDD radio system 100, comprising a transmitter 120 and a receiver 140. The transmitter front-end section is shown to comprise a power amplifier 130 and a duplexer 110, other analog circuitry is omitted for simplicity. The receiver front-end section comprises a duplexer 110, at least one Low Noise Amplifier (LNA) 150, and a band-pass SAW filter 160. The received input signal 151 is amplified and then filtered by the LNA 150 and the SAW filter 160, respectively. The mixer 170 down-converts the filtered signal 171 to baseband (DC) frequency with a plurality of local oscillators signals LO, thus generating a plurality of down-converted signals. The down-converted signals are amplified by a variable gain amplifier 180, combined by an adder 190 (not shown as a block in the figure) to output the reconstructed baseband signal. Before applying any digital baseband processing, the baseband is filtered by a low-pass filter 200.

Figure 2:
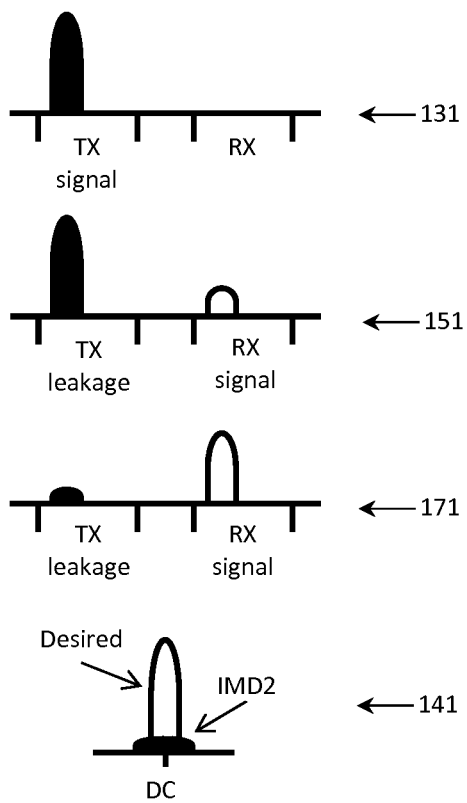
FIG. 2 illustrates, in the conventional FDD radio system of FIG. 1, the signals at the output of the transmitter, at the input of the receiver, at the input of the harmonic rejection mixer and at the output of the receiver front-end.

FIG. 2 illustrates the transmitter output signal 131, the LNA input signal 151, the mixer input signal 171, and the output signal 141 of the receiver front-end, respectively, for the FDD system of FIG. 1. Due to transmitter frequency leakage, caused by the imperfection of the duplexer, the LNA input signal 151 comprises transmitter leakage (TX leakage) and the received signal (the desired signal). The SAW filter attenuates undesired signals (e.g., out-of-band signals). In addition, the SAW filter suppresses a leakage signal leaked from the transmitter into the receiver through the duplexer. The use of a SAW filter helps to guarantee a low IMD2 product at the receiver front-end output. Only the non-suppressed parts of the unwanted signals in 171 contribute to the generation of IMD2 products at baseband frequency. As shown in signal 141, the generated IMD2 product is small with respect to the desired signal and thus does not degrade the SNR at the receiver.

Figure 3:
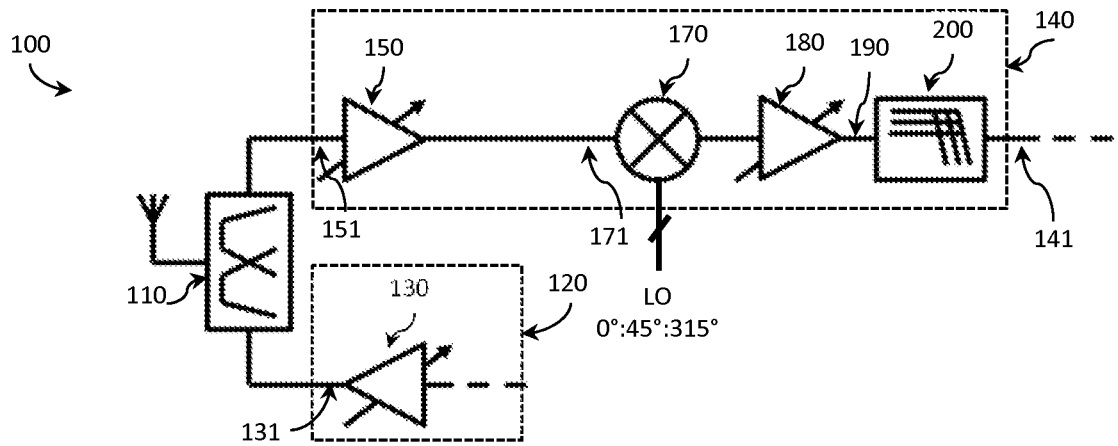
FIG. 3 illustrates an FDD radio system of FIG. 1 without a band-pass filter.
Figure 4:
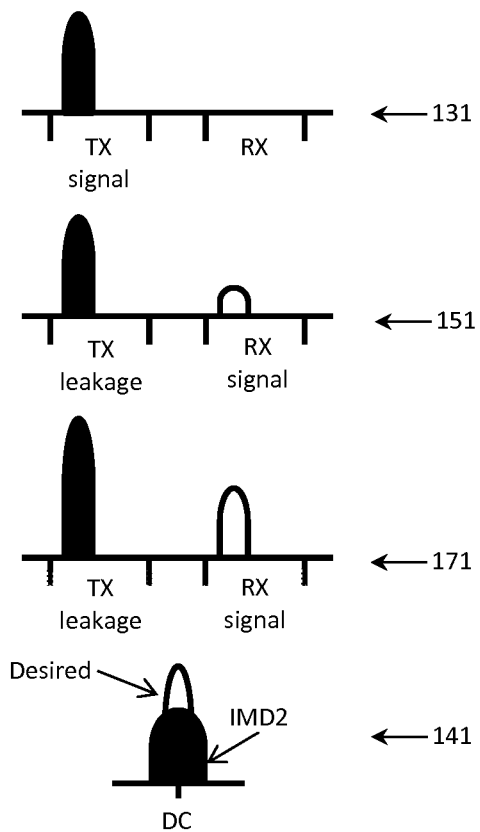
FIG. 4 illustrates, in the FDD radio system of FIG. 3, the signals at the output of the transmitter, at the input of the receiver, at the input of the harmonic rejection mixer, and at the output of the receiver front-end.

FIG. 3 shows an example FDD radio system without a SAW filter in the receiver. FIG. 4 shows the respective signals of the radio system of FIG. 3 at the LNA input 151, at the mixer input 171, and at the receiver front-end output 141. Without the SAW filter, however, the unwanted signals (i.e., the TX leakage) are not suppressed and the IMD2 component at DC frequency is much bigger (see signal 141 in FIG. 4). This leads to poor signal-to-noise ratio (SNR) and, thus, makes it difficult to meet the required receiver sensitivity.

To maintain high sensitivity, when no SAW filter is provided, it is required to guarantee a high receiver linearity as well as a good noise figure. Major sources of non-linearity affecting the second order intercept point (IP2) performance of a receiver include transistor mismatch and layout asymmetry in the mixer. A mixer is a non-linear circuit essentially comprised of transistors. For example, a differential Gilbert-cell mixer includes four transistors acting as non-linear switches. Transistor mismatch in the four transistors causes the signal at the differential output of the mixer to be different. The greater the transistor mismatch in the mixer, the greater the difference between the differential output signal and the lower the IP2. Ideally, the differential output signal should be matched, e.g., the difference between the positive and the negative baseband signal should be zero. Thus, to provide a high second order intercept point (IP2) and hence to improve the IP2 performance of the receiver, the mismatch of a mixer needs to be calibrated/eliminated. There are a number of conventional transistor mismatch calibrating techniques, for example, by changing transistor gate voltage, mixer common mode voltage, or current injection. Each of these calibration techniques effectively changes the output current of the transistor(s). Other transistor parameters could also be adjusted to correct for the IP2.

A harmonic rejection mixer (HRM) is commonly used for cancellation of, for example, third, fifth, and higher order harmonics. Such mixers are widely used, e.g., in television receivers, but recently they have been frequently applied in wireless devices as well. In order to deal with $3^{rd}$ and $5^{th}$ order harmonics a harmonic rejection mixer uses eight phases. However, depending on the order of the harmonics to be suppressed, the harmonic rejection mixer can be extended to use a greater number of phases, for example, 12 phases, 16 phases, and so on.

Figure 5:
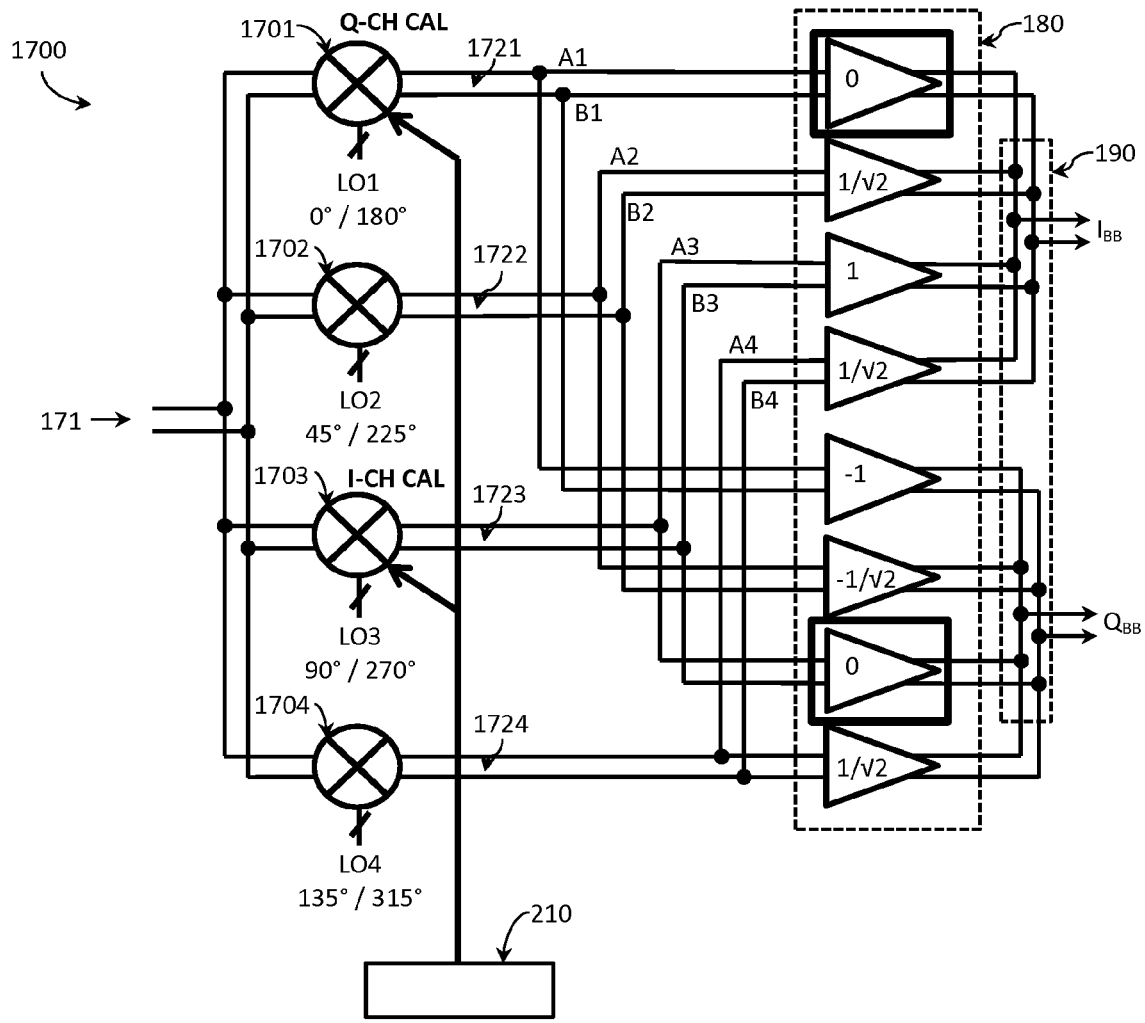
FIG. 5 illustrates a differential harmonic rejection mixer according to an embodiment.

FIG. 5 shows an embodiment of the present disclosure with a harmonic rejection mixer 1700 comprising a plurality of mixers 1701-1704 multiplying a radio frequency signal 171 with a plurality of local oscillator signals LO1-LO4 phase shifted with respect to each other. Each mixer outputs a down-converted signal 1721-1724 having a phase shift determined by the phase shift of the respective LO signal. Amplifiers 180 amplify each down-converted signal with an amplification factor depending on its phase shift. The amplified signals are then combined together by the adder 190 to produce the in-phase component $I_{BB}$ and quadrature component $Q_{BB}$ of the baseband signal.

In comparison to a conventional quadrature differential (4-phase) mixer using four phases (e.g., 0°, 90°, 180° and 270°), a differential HRM mixer designed for cancelling $3^{rd}$ and $5^{th}$ harmonics (HR3 and HR5, respectively) uses 8 phases with an incremental phase step of 45°, e.g., 0°, 45°, 90°, 135°, 180°, 225°, 270°, and 315° phase. In such a HRM mixer the $3^{rd}$ and $5^{th}$ harmonics in the reconstructed in-phase baseband component $I_{BB}$ are cancelled by amplifying down-converted signals with phases rotated over 45°, 90°, and 135° with an appropriate amplification factor, for example $1/\sqrt{2}$, 1, and $1/\sqrt{2}$, and then summing them together. For the quadrature baseband component $Q_{BB}$ this is achieved by summing down-converted signals with phases rotated over 0°, 45°, and 135° after their amplification with $-1$, $-1/\sqrt{2}$, and $1/\sqrt{2}$ amplification factors. Similarly, for the differential phases, e.g., 180°, 225°, 270°, and 315°. As a result, no HR3 or HR5 frequency components are generated in the in-phase and the quadrature baseband signal at the HRM mixer output.

Conventional methods for calibrating a harmonic rejection mixer to reduce a second order intermodulation distortion (IMD2) product at its output calibrate each individual mixer that contributes to the reconstruction of the respective baseband signal components. To reduce the IMD2 in the $I_{BB}$ and $Q_{BB}$ components, mixers 1702, 1703, 1704 and 1701, 1702, 1704 need to be calibrated, respectively. Such calibration can be costly, as calibration circuitry is required for each individual mixer, and time consuming, as each mixer is calibrated individually. In addition, as the reconstruction of the in-phase baseband component $I_{BB}$ and the quadrature baseband component $Q_{BB}$ is in fact a combination of the down-converted signals 1721-1724, calibrating some of the mixers has an impact on the IMD2 product on both I- and Q-baseband signals. This additionally complicates the IP2 calibration of the HRM mixer as convergence (e.g., reaching a minimum point) can be difficult to achieve; calibration is performed in an iterative manner (e.g., at each iteration different mixer(s) need to be calibrated and the IMD2 at both I- and Q-baseband signal components needs to be measured).

It has been determined that in a harmonic rejection mixer the IMD2 product in the in-phase or quadrature baseband signal component $I_{BB}$; $Q_{BB}$ can be reduced or even eliminated (canceled out) by calibrating only the mixer not contributing to the reconstruction of one of the baseband signal component. That is, the IMD2 product caused by mismatch in any of the mixers (e.g., 1702, 1703, 1704) involved in the reconstruction of a respective baseband signal component (e.g., $I_{BB}$) is reduced or even eliminated by calibrating only one of the respective mixers (e.g., 1703) to compensate for the overall mismatch contributed by these mixers. As the calibrated mixer is not affecting the reconstruction of the other baseband signal component (e.g., $Q_{BB}$), e.g., its output signal is fed to a zero-gain amplifier, the interdependence between the IP2 calibration of the in-phase and quadrature baseband signals is eliminated. This way a high second order intercept point (IP2) can be achieved by calibrating only two mixers, one mixer for each respective baseband signal components. This applies for any HRM cancelling $3^{rd}$, $5^{th}$, or higher harmonics. Mixer mismatch is caused by transistor mismatch and layout asymmetry which changes (e.g., offsets) the output current of a mixer. Adjusting transistor mismatch can be achieved by conventional mismatch calibrating techniques, for example, by changing transistor gate voltage, mixer common mode voltage, or current injection. Each of these calibration techniques changes the output current of the transistor(s) in a mixer. Other transistor parameters could also be adjusted to correct for the IP2 with the method of the present disclosure.

In one embodiment, the present disclosure proposes a method for reducing second order intermodulation distortion (IMD2) in a harmonic rejection mixer, by reducing individually the IMD2 in the reconstructed I- and Q-baseband signal components $I_{BB}$, $Q_{BB}$. The method proposes compensating a transistor mismatch in a first mixer 1701 to reduce the IMD2 product in the quadrature component $Q_{BB}$, by adjusting the output current of the first mixer and calibrating a second mixer 1703 to reduce the IMD2 product in the in-phase baseband signal $I_{BB}$ by adjusting its output current. The output current of the respective mixer can be adjusted by adjusting the output current of at least one of its transistors using any conventional technique as described above. The output current of the transistor(s) in the first mixer 1701 and the second mixer 1703 is adjusted until a certain value guaranteeing the IMD2 product in the respective Q- and I-baseband signal is sufficiently low. The value of the IMD2 product in the in-phase and the quadrature component may be different, however both values should meet the IP2 requirements set by the telecommunication standard, such as GSM, WCDMA, LTE, WLAN, etc.

In another embodiment, the output current of the transistor(s) in the first mixer 1701 may be adjusted until a minimum of the IMD2 product in the quadrature component of the baseband signal $Q_{BB}$ is reached.

In a further embodiment, the output current of the transistor(s) in the second mixer 1703 may be adjusted until a minimum of the IMD2 product in the in-phase baseband signal $I_{BB}$ is reached.

The calibration circuitry 210 arranged for calibrating the first and the second mixer is designed to provide for sufficient range of mismatch compensation, e.g., to provide a sufficient range for adjusting the output current of the transistor(s), so that the IMD2 product in the baseband signal may be reduced to meet the IP2 requirements set by the telecommunication standard. This range depends on the mismatch in each mixer and the scaling factors (amplification factors) applied on signals at the output of the mixers—down-converted signals 1721-1724. The calibration circuitry may be realized by a digital-to-analog converter (DAC) and a control logic circuit. The control logic circuit controls the operation of the DAC based on detected changes in the IMD2. The signal at the output of the DAC controls the output current of the transistor(s), for example, by modifying the voltage applied at the transistor bias. Instead of control logic circuit, a software program may be used to control the operation of the DAC.

In a further embodiment, the first mixer 1701 and the second mixer 1703 being calibrated are chosen to allow for independent IP2 calibration of the in-phase and quadrature baseband signal, by calibrating a mixer which does not contribute to the reconstruction of both the I- and Q-baseband components—the output signal of the mixer is amplified with zero gain. For example, the down-converted signal 1721 at the output of the first mixer 1701 is amplified with a factor of zero before combining it with the other down-converted signals 1722-1724 to produce the in-phase signal $I_{BB}$. Similarly, the down-converted signal 1723 at the output of the second mixer 1703 is amplified with a factor of zero before combining it with the other down-converted signals 1721, 1722, 1724 to produce the quadrature signal $Q_{BB}$. Thus, the IMD2 of $I_{BB}$ may be reduced independently from the IMD2 of $Q_{BB}$, and vice versa. This allows the IP2 calibration to be achieved by calibrating only two mixers, and hence only two calibration circuits are required as, for example, for the calibration of a conventional four-phase mixer. This greatly simplifies the circuit design, the area footprint and the overall power consumption of the radio device.

In yet another embodiment, each individual mixer 1701-1704 may be a differential mixer. In this case, each mixer outputs a differential down-converted signal and the reconstructed baseband signal components $I_{BB}$, $Q_{BB}$ are also differential. Using differential mixers helps to more effectively reduce the second order distortion, as for the calibration it is only required to equalize the IMD2 products in each respective differential output of the harmonic rejection mixer 170. For example, the IMD2 product in the $I_{BB}$ may be completely eliminated when the corresponding IMD2 products in the differential signal $I_{BB}$+ and $I_{BB}$− cancel each other.

Equations (1) and (2) show the contribution of each individual mixer to the overall IMD2 product for each baseband signal component, respectively. Considering the mixers are differential, each mixer contributes an amount A and B to the overall IMD2 of the respective baseband signal component. For example, A1 and B1 are the amounts of IMD2 generated by the first mixer 1701 at its respective differential outputs. A2 and B2 are the IMD2 amounts generated by mixer 1702. The IMD2 for the I-component of the baseband signal is reduced by calibrating the second mixer 1703. Adjusting the output current of the transistor(s) of the second mixer changes coefficients k1 and k2 and, thus, the amount of the IMD2 at the differential output of the mixer 1703. IP2 calibration of $I_{BB}$ is achieved when each k1 and k2 coefficient reaches a value such that the resulting IMD2 in the differential $I_{BB}$+ and $I_{BB}$− baseband signals are equalized and hence $IMD2_{I_{BB}}$ is equal to zero. Similarly, IP2 calibration of the second baseband signal $I_{BB}$ is achieved when each n1 and n2 coefficients reach a value such that the resulting IMD2 in the differential $Q_{BB}$+ and $Q_{BB}$− baseband signals are equalized and hence $IMD2_{Q_{BB}}$ is equal to zero. This allows a cost efficient and time saving calibration.

$$IMD2_{I_{BB}} = \qquad (1)$$
$$IMD2\left[\frac{1}{\sqrt{2}}(A2-B2) + 1(k_1 A3 - k_2 B3) + \frac{1}{\sqrt{2}}(A4-B4)\right] = 0$$

$$IMD2_{Q_{BB}} = \qquad (2)$$
$$IMD2\left[-1(n_1 A1 - n_2 B1) - \frac{1}{\sqrt{2}}(A2-B2) + \frac{1}{\sqrt{2}}(A3-B3)\right] = 0$$

Figure 6:
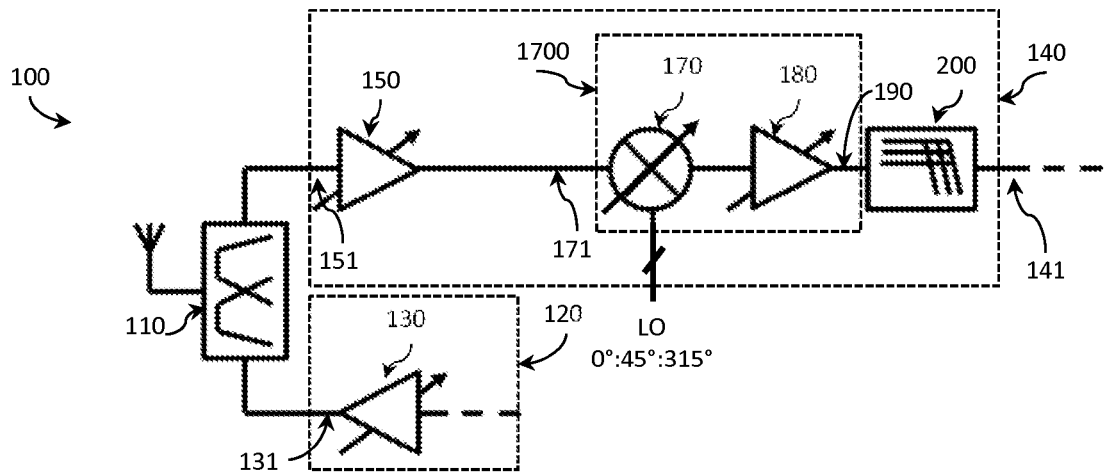
FIG. 6 illustrates an FDD radio system of FIG. 3 employing a harmonic rejection mixer according to an embodiment.

FIG. 6 shows an FDD radio system 100 comprising the harmonic rejection mixer 1700 of FIG. 5, comprising four differential mixers 1701-1704, illustrated as a single mixer 170, each of them arranged to multiply the signal at its respective input with a pair of LO signals each having a different phase. The down-converted signals at the outputs of the four mixers are first amplified by amplifiers 180 and then combined by the adder 190 to realize the harmonic rejection mixing of I-channel and Q-channel baseband signal. In the figure, the mixer 170 receives a local oscillator signal with 8 different phases with an incremental step of 45° (LO) 0°:45°: 315°. The adder 190 combining the down-converted signals to produce the I- and Q-baseband signals is not illustrated as a block, but only its location is indicated.

Figure 7:
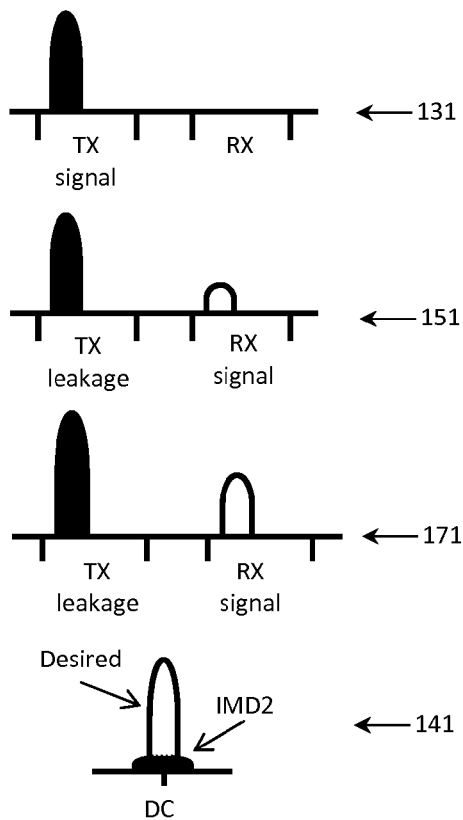
FIG. 7 illustrates, in the FDD radio system of FIG. 6, the signals at the output of the transmitter, at the input of the receiver, at the input of the harmonic rejection mixer, and at the output of the receiver front-end.

FIG. 7 shows signals of the radio system of FIG. 6 at the input of the LNA 151, at the input of the harmonic rejection mixer 171, and at the output of the front-end of the receiver 141, respectively. Without the SAW filter and with the proposed calibration method, however, the unwanted signals are sufficiently suppressed and the IMD2 component at baseband frequency is sufficiently lowered (see 141 in FIG. 4) to meet the IP2 requirements for the receiver as set by the telecommunication standards. The method helps to guarantee a high signal-to-noise ratio (SNR) and helps to guarantee the required receiver sensitivity.

Figure 8:
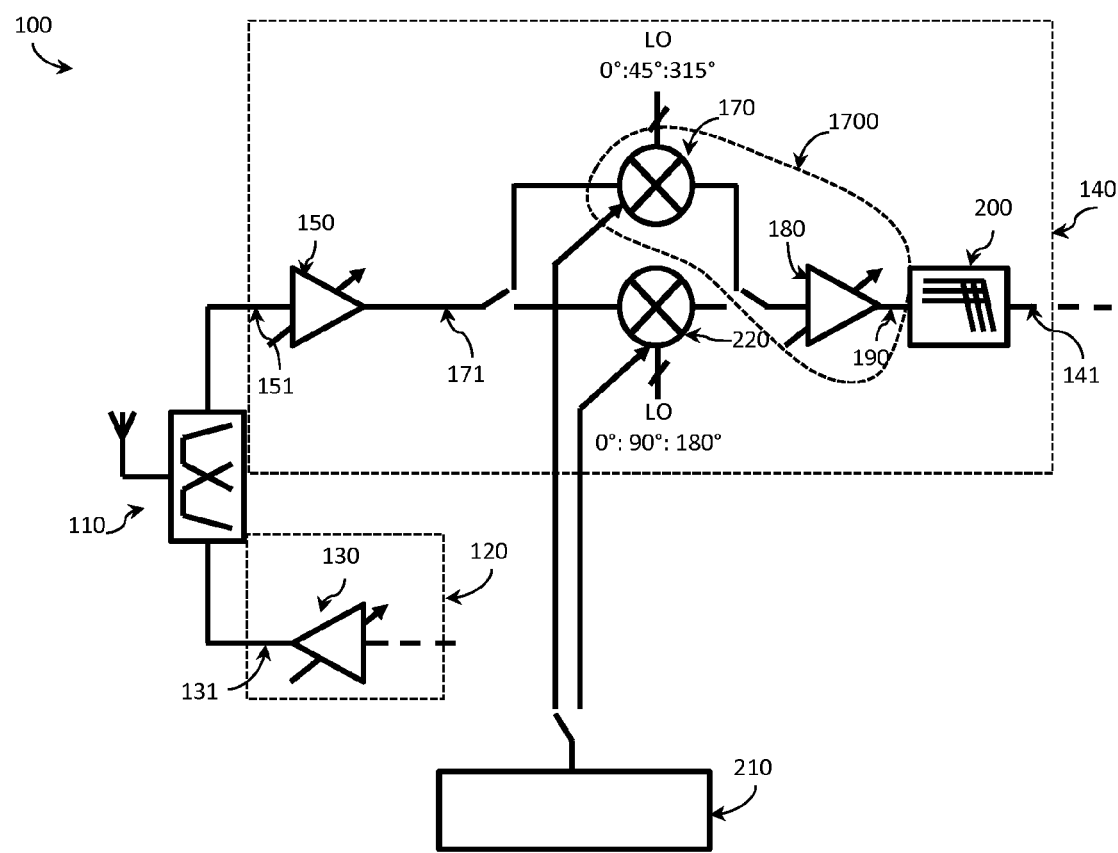
FIG. 8 illustrates a wireless device with a receiver having a harmonic rejection mixer and a four-phase mixer.

In another embodiment, the method may be used for reducing second order intermodulation distortion (IMD2) in a wireless device. FIG. 8 shows an example of a wireless device comprising a harmonic rejection mixer 1700 realized by mixer 170 together with amplifiers 180 and adder 190 (only its location in the device is illustrated). The wireless device may as well comprise a conventional four-phase mixer 220. Experiment results show that the proposed method can be applied for calibrating both the harmonic rejection mixer 1700 and the conventional mixer 220 and achieved high enough IP2 to guarantee receiver sensitivity in accordance with the telecommunication standards (e.g., GSM, WCDMA, LTE, WLAN, etc.).

This allows using the same calibration circuitry as for a conventional four-phase mixer. So, in a radio device comprising a harmonic rejection mixer and a conventional four-phase mixer only one calibration circuitry can be used for the calibration of each of them.

The method of the present disclosure offers a number of potential benefits and advantages. It reduces the required calibration circuitry. For a harmonic rejection mixer designed for cancellation of third and fifth order harmonics, only two calibration circuits are required. In this case, it is necessary to calibrate only 2 mixers, instead of all four. In case of a HRM designed for cancellation of even higher harmonics, again only 2 mixers are calibrated, instead of 6 or more. The calibration technique, thus, offers low complexity, as the collective mismatch of each I- and Q-channel (e.g., the mismatch of each mixer contributing to the reconstruction of the respective baseband signal components) is calibrated independently of the other. This allows each quadrature channel to be calibrated, separately.

While the disclosure has been illustrated and described in detail in the drawings and foregoing description, such illustration and description are to be considered illustrative or exemplary and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method for reducing second order intermodulation distortion in a harmonic rejection mixer arranged for down-converting a radio frequency signal to an in-phase and a quadrature baseband signal, the harmonic rejection mixer including a plurality of mixers arranged for multiplying the radio frequency signal with a plurality of local oscillator signals, each local oscillator signal having a different phase with respect to the other local oscillator signals, thereby obtaining a plurality of down-converted signals having different phases with respect to each other, a plurality of amplifiers arranged for amplifying each down-converted signal with an amplification factor depending on its phase, and a plurality of summing means for summing the plurality of amplified down-converted signals to produce the in-phase and the quadrature baseband signals, the method comprising:
   adjusting an output current of a first mixer, to reduce the second order intermodulation distortion in the quadrature baseband signal to a first value, wherein the first mixer is not contributing to the reconstruction of the in-phase baseband signal; and
   adjusting an output current of a second mixer, to reduce the second order intermodulation distortion in the in-phase baseband signal to a second value, wherein the second mixer is not contributing to the reconstruction of the quadrature baseband signal.

2. The method according to claim 1, wherein the first value is a minimum of the second order intermodulation distortion in the quadrature baseband signal.

3. The method according to claim 1, wherein the second value is a minimum of the second order intermodulation distortion in the in-phase baseband signal.

4. The method according to claim 1, wherein each mixer is a differential mixer.

5. The method according to claim 1 used in a wireless device.

* * * * *